United States Patent [19]

Uekita et al.

[11] Patent Number: 4,557,784
[45] Date of Patent: Dec. 10, 1985

[54] CONTINUOUS PROCESS FOR PRODUCING A METAL CLAD LAMINATE

[75] Inventors: Masakazu Uekita, Kobe; Yasuo Fushiki, Takatsuki; Masayuki Ooizumi, Kobe, all of Japan

[73] Assignee: Kanegafuchi Kagaku Kogyo Kabushiki Kaisha, Osaka, Japan

[21] Appl. No.: 163,695

[22] Filed: Jun. 27, 1980

[30] Foreign Application Priority Data

Jun. 29, 1979 [JP] Japan .................................. 54-83239

[51] Int. Cl.⁴ .............................................. C09J 5/02
[52] U.S. Cl. .................................. 156/307.7; 156/310; 156/314; 156/322; 156/324; 156/330; 428/416; 428/420
[58] Field of Search ............... 156/310, 314, 322, 324, 156/330, 307.7; 427/386, 410; 428/416, 420

[56] References Cited

U.S. PATENT DOCUMENTS 2,651,589  9/1953  Shokal et al. ..................... 156/310
3,902,951  9/1975  Doi et al. ......................... 156/330 X
3,981,762  9/1976  Davis et al. ..................... 156/322 X Primary Examiner—Robert A. Dawson
Attorney, Agent, or Firm—Haight & Associates

[57] ABSTRACT

A metal clad laminate is produced in continuous manner by impregnating a plurality of fibrous substrate with a curable liquid resin, combining said plurality of substrates together and simultaneously laminating a metal foil onto at least one side of said substrates, and curing the laminate. The improvement comprises the steps of applying an adhesive onto said metal foil to form a film and heating said film in situ continuously prior to step of laminating step of said metal foil.

2 Claims, 1 Drawing Figure

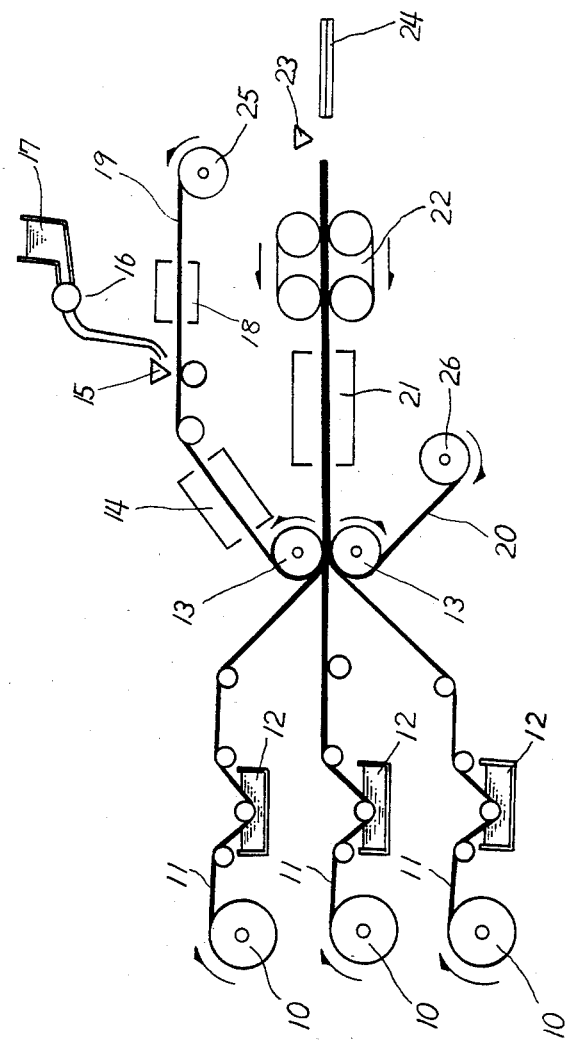

CONTINUOUS PROCESS FOR PRODUCING A METAL CLAD LAMINATE

This invention relates to a continuous process for producing a metal clad laminate of electrical grade, for example, a copper clad reinforced laminate for use as printed circuit wiring board.

A batch-type process commonly used in the manufacture of such metal clad laminates includes the steps impregnating a fibrous substrate with a resin solution, partially curing the resin to form prepreg, stacking a plurality of prepreg, applying a metal foil onto the stack and then heating the combination of the stack and the metal foil under pressure. The metal foil is preliminary given a coating of an adhesive and the coating is baked tack-free to so-called "B" stage before the application onto the stack. This batch-type process naturally requires large amounts of hand labor and its productivity is low compared with continuous processes.

Accordingly, it is an object of this invention to provide a process for producing a metal clad reinforced laminate in which the laminate is produced in a continuous manner with higher productivity at a reduced production cost.

Other objects and advantages will become apparent as the description proceeds.

According to the present invention, a plurality of fibrous substrate is continuously impregnated with a curable liquid resin and the resin-impregnated substrates are combined to form a unitary member. At the same time a metal foil is laminated onto one or both sides of the combined substrates and the entire structure is heated for curing. The improvement resides in the steps prior to said laminating step of applying an adhesive onto said metal foil to form a film and heating said film. These steps greatly improve the peel strength and solder dip resistance of the resulting metal clad laminate.

The FIGURE is a schematic drawing of an apparatus as applied in effecting the process according to an embodiment of the present invention.

With reference to the drawing a plurality of fibrous substrate 11 is stored as rolls 10 and unwound from the rolls. Each substrate passes through a resin bath 12 where the substrate is impregnated with a liquid resin. The impregnated substrates are combined together between a pair of laminating rollers 13 by passing through the nip therebetween. A metal foil such as copper foil 19 is unwound from a roll 25 and dried in a drying chamber 18. A liquid adhesive is stored in a reservoir 17 and supplied through a flow regulator 16 onto the surface of metal foil 19. The adhesive is applied by a doctor 15 to form a film of uniform thickness. Then the metal foil proceeds into a heating chamber 16 where the film of adhesive coating is heated.

The metal foil is laminated on the upperside of the combined resin-impregnated substrates between a pair of laminating rollers 13. The underside of the combined substrate is supported by a covering film 20 such as cellophane or polyester film which supports and protects the uncured laminate during the subsequent steps. The covering film 20 is stored as a roll 26 opposite the roll 25 relative to the laminating rollers 13. The combined clad laminate passes through a curing chamber 21 where the laminate is cured. The cured laminate is driven by a pulling device 22 to a cutter 23 where the finished laminate 24 is cut into a suitable size.

It is to be understood the invention is not limited to the particular embodiment as shown. For example the doctor 15 may be replaced by other coaters such as a roller coater, a blade coater or a wire bar coater, and the covering film 20 may be replaced by a metal foil with associated devices.

It is essential for the process of the invention that the adhesive film applied on the metal foil is subjected to a heat treatment prior to the lamination step of metal foil onto the combined substrate. The heating may be carried out generally at a temperature from 80° C. to 170° C. for 0.5 to 15 minutes. The adhesive film need not be dried or cured tack-free after the heat treatment but preferably retains its tackiness to a small extent. Suitable conditions depend on the types of particular adhesives.

The advantages resulting from this heat treatment include (a) removal of solvent present in the adhesive, (b) precuring the adhesive to match with the curing speed of the resin used for the impregnation of substrates and (c) removal of entrapped air or other gas bubbles which would otherwise adversely affect on the properties of the finished laminate.

It is also essential for the process of the invention to effect the steps of application and heating of adhesive film in situ continuously prior to the lamination of metal foil onto the combined resin-impregnated substrates. This eliminates the need for a separate step of preparing a cladding metal foil having an adhesive layer and prevents the adhesive layer from sticking during handling thereof. Furthermore this feature enables the use of such adhesives whose pot life is relatively short, such as two component epoxy resins. Thus the maximum efficiency and high peel strength may be obtained only when the application and heating of the film of adhesive applied to the metal foil are effected in situ prior to the laminating step thereof on the combined resin-impregnated substrates.

It is preferable that the film of adhesive has a thickness from 10 to 200 μm, more preferably from 20 to 100 μm.

In a preferable embodiment of this invention, the curable liquid resin and also the adhesive are capable of curing without the formation of any volatile by-product. The metal clad laminate produced from these materials may be cured substantially without applying lateral pressure.

Any conventional fibrous substrate such as woven or nonwoven fabrics made of glass fiber or asbestos, or papers made of kraft pulp or cotten linter pulp may be used. The substrate may be pretreated for improving moisture resistance thereof, for example, as described in a co-pending application of Fushiki et al Ser. No. 06/43086, filed Apr. 23, 1980, now U.S. Pat. No. 4,336,297, assigned to the same assignee as the present application.

A variety of curable liquid resins may be used for impregnating the fibrous substrate. Examples thereof include unsaturated polyester resins, vinyl ester resins (DERAKENE), epoxy resins, diallylphthalate resins or similar resinous compounds. The same resins may be used as adhesive for bonding the cladding metal foil to the laminate.

In a preferred embodiment, the fibrous substrate is a kraft paper, the curable liquid resin is an unsaturated polyester resin and the adhesive is an epoxy resin. Curable unsaturated polyester resins are, as well known, mixtures of a condensate of a saturated dicarboxylic acid such as phthalic or isophthalic acid, an unsaturated dicarboxylic acid such as maleic acid and a diol such as ethyleneglycol with a crosslinking monomer such as styrene. Bisphenol A polyester resins or vinyl ester resins (DERAKENE) may also be used. Preferably they have a viscosity from 0.1 to 30 poise and when fully cured, a glass transition point less than 100° C.

Bishenol A epoxy resins are preferable. Amine or amide type curing agents are preferable such as an aliphatic or aromatic amine, polyamide resins, amino group-terminated polybutadiene-nitrile rubber or mixtures thereof.

When said epoxy resin contains an amine or amide type curing agent, the unsaturated polyester resin preferably contains a catalyst of peroxyketal or peroxyester or dialkylperoxide type. Other catalysts such as cumene hydroperoxide often cause exessive acceleration of the curing of adhesive resin and thus adversely affects on the peel strength and/or solder dip resistance of the resulting clad laminate. Examples of usable peroxide catalysts are 1,1-bis(t-butylperoxy)-3, 3,5-trimethylcyclohexane, 1,1-bis(t-butylperoxy)cyclohexane, n-butyl-4,4-bis(t-butylperoxy) valeratem, di-t-butylperoxide, 2,5-dimethyl-2,5-di-t-butylperoxyhexine-3,-t-butylperoxyacetate, t-butylperoxy-2-ethylhexanoate, t-butylperoxylaurate, t-butyloxybenzoate and the like. The preferable amount of these catalysts ranges from 0.5 to 2.0% by weight.

Adhesion between the polyester resin and the epoxy resin may be improved by interposing an additional layer of a compound having an unsaturated group and an epoxy group in the molecule between the adhesive layer and the resin-impregnated substrate. Said compound has a high affinity with both epoxy resin and polyester resin and may improve the peel strength. Examples thereof include glycidyl methacrylate, glycidyl allyl ether or partially exoxylated soybean oil.

The thermal treatment of adhesive resin layer applied to cladding metal foil is such that the resin is partially cured up to "B" stage, preferably between "A" stage and "B" stage. Excessive cure in this step may result in an adverse effect on the peel strength and insufficient curing may permit diffusion of low molecular components from the curable resin layer into the adhesive layer with adverse effects.

By following the teachings of this invention, a metal clad laminate of NEMA grade from XP to XXXCP having a peel strength from 1.6 to 2.0 kg/cm may be produced with high productivity at low production cost.

The invention is further illustrated by the following examples in which all parts and percents are by weight.

EXAMPLE 1

A kraft paper having a basis weight of about 150 g/m$^2$ (MKP-150, Tomoegawa Paper Co., Ltd.) was pretreated by soaking in a 10% methanolic solution of N-methylolacrylamide and drying. Using an apparatus shown in the drawing, the pre-treated paper substrate was impregnated with a mixture of 100 parts of commercial liquid unsaturated polyester resin (Polymal 6304, Takeda Chemical Industries, Ltd.) and 1 part of cyclohexanoneperoxide.

An electrolytic copper foil (CF-T5, Fukuda Metallic Foil Co., Ltd.) was coated with an adhesive consisting of a commercial epoxy resin (Epicoat 828, Shell Chemical), a commercial polyamide resin (Versamid 125, Henkel Japan) and a commercial amino group-terminated polybutadiene-nitrile rubber (ATBN, B. F. Goodrich) in a proportion of 7:2:1 to a thickness of about 60 μm. The adhesive layer was heated at 100° C. until it retained a little tackiness.

Six plies of the resin-impregnated substrate were combined together by passing through a pair of laminating rollers while sandwiching between the foregoing copper foil and a polyester film 50 μm thick. The combined laminate was passed through a curing chamber in which hot air is circulated at 110° C. for 30 minutes, cut into a suitable size and then subjected to post-curing at 150° C. for 30 minutes. A copper clad laminate of 1.6 mm thick was obtained. The properties of this copper clad laminate are shown in Table 1.

EXAMPLE 2

Example 1 was repeated except that the peroxide catalyst was replaced by an equivalent amount of 1,1-bis(t-butylperoxy)-3,3,5-trimethylcyclohexane. The properties of the resulting laminate are shown in Table 1.

EXAMPLE 3

Example 2 was repeated except that a liquid resin similar to that used in the impregnating step but containing 8 parts of glycidyl methacrylate was continuously fed to the interface between the resin-impregnated substrate and the adhesive layer. The properties of the resulting laminate are shown in Table 1.

REFERENCE EXAMPLE 1

Example 1 was repeated except that the adhesive layer was not heated at all prior to the lamination of copper foil. The properties of the resulting laminate are shown in Table 1.

TABLE 1

| Item | Condition JIS C-6481 | Ex. 1 | Ex. 2 | Ex. 3 | Ref. Ex. 1 |
|---|---|---|---|---|---|
| Solder dip resistance, sec. | C-90/23/65 | 70 | 130 | 130 | 40 |
|  | C-90/23/65 + C-96/40/95 | 10 | 30 | 30 | 8 |
| Surface resistivity of clad side, ohms/cm$^2$ | C-90/23/65 | 3 × 10$^{13}$ | 6 × 10$^{13}$ | 6 × 10$^{13}$ | 1 × 10$^{-}$ |
|  | C-90/23/65 + C-96/40/95 | 2 × 10$^{10}$ | 5 × 10$^{12}$ | 5 × 10$^{12}$ | 5 × 10$^{9}$ |
| Peel strength, kg/cm | C-90/23/65 | 1.65 | 1.90 | 2.10 | 1.60 |
|  | C-90/23/65 + C-96/40/95 | 1.50 | 1.75 | 1.80 | 1.40 |
| Presence of entrapped bubbles in adhesive layer |  | None | None | None | Yes |

EXAMPLE 4 AND REFERENCE EXAMPLE 2

Example 2 was repeated except that the adhesive layer was partially cured to "B" stage by heating at 100° C. for 12 minutes and the resulting copper foil was laminated immediately thereafter (Example 4), or after 3 days storage on a take-up roll (Reference Example 2). The properties of the resulting laminates are shown in Table 2.

TABLE 2

| Item | Condition, JIS C-6431 | Ex. 4 | Ref. Ex. 2 |
|---|---|---|---|
| Peel strength, kg/cm | C-90/23/65 | 1.80 | >0.30 |
|  | C-90/23/65 + C-96/40/95 | 1.70 | — |

We claim:

1. In a continuous process for producing a metal clad laminate comprising the steps of impregnating a plurality of fibrous substrates with a curable liquid unsaturated polyester resin, combining the resin-impregnated substrate together and simultaneously laminating a metal foil onto at least one side of the combined substrates, and curing the resulting laminate, the improvement comprising the steps of:

(a) continuously applying a composition consisting essentially of a curable liquid epoxy resin adhesive containing an amine or amide type curing agent onto the side of said metal foil which faces the combined substrates in the finished laminate to form a film;

(b) interposing an additional layer of a compound having a copolymerizable unsaturated bond and an epoxy group in the molecule at the interface between the resin-impregnated substrate and the adhesive film; and (c) continuously heating said film in situ to remove solvent and gas bubbles present in the adhesive film and to precure said film sufficiently to prevent the adverse effects of low molecular weight components diffusing from the curable resin layer into the adhesive layer immediately prior continuously laminating said metal foil.

2. The process of claim 1, said compound is glycidyl methacrylate, glycidyl allyl ether or partially epoxylated soybean oil.

* * * * *